United States Patent
Hammer et al.

(10) Patent No.: US 8,097,080 B2
(45) Date of Patent: Jan. 17, 2012

(54) METHOD OF CUTTING SINGLE CRYSTALS

(75) Inventors: Ralf Hammer, Freiberg (DE); Manfred Jurisch, Dresden (DE)

(73) Assignee: Freiberger Compound Materials GmbH, Freiberg (DE)

( * ) Notice: Subject to any disclaimer, the term of this patent is extended or adjusted under 35 U.S.C. 154(b) by 607 days.

(21) Appl. No.: 12/271,245

(22) Filed: Nov. 14, 2008

(65) Prior Publication Data

US 2009/0283761 A1    Nov. 19, 2009

Related U.S. Application Data

(60) Provisional application No. 60/996,396, filed on Nov. 15, 2007.

(30) Foreign Application Priority Data

Nov. 15, 2007 (DE) .................. 10 2007 056 115

(51) Int. Cl.
    *C30B 33/00* (2006.01)
(52) U.S. Cl. ............... 117/35; 117/97; 117/915; 451/5; 125/13.01; 125/21
(58) Field of Classification Search .......... 117/35, 117/97, 915; 451/5; 125/13.01, 21
See application file for complete search history.

(56) References Cited

U.S. PATENT DOCUMENTS

| | | | |
|---|---|---|---|
| 4,244,348 A * | 1/1981 | Wilkes | 125/23.01 |
| 5,154,333 A | 10/1992 | Bauer et al. | |
| 5,279,077 A | 1/1994 | Miyashita et al. | |
| 5,393,707 A * | 2/1995 | Canning | 438/33 |
| 5,439,723 A | 8/1995 | Miyashita et al. | |
| 6,252,197 B1 | 6/2001 | Hoekstra et al. | |
| 2008/0179547 A1* | 7/2008 | Henley | 250/492.21 |

FOREIGN PATENT DOCUMENTS

DE    28 13 302 B1    1/1979
(Continued)

OTHER PUBLICATIONS

Qian et al., "First-principles calculations of atomic and electronic structure of the GaAs(110) surface", Physical Review B, vol. 37, No. 3, Jan. 15, 1988, pp. 1303-1307.

(Continued)

*Primary Examiner* — Matthew Song
(74) *Attorney, Agent, or Firm* — Foley & Lardner LLP

(57) ABSTRACT

A method of dividing single crystals, particularly of plates of parts thereof, is proposed, which can comprise: pre-adjusting the crystallographic cleavage plane (2') relative to the cleavage device, setting a tensional intensity (K) by means of tensional fields (3', 4'), determining an energy release rate $G(\alpha)$ in dependence from a possible deflection angle ($\alpha$) from the cleavage plane (2') upon crack propagation, controlling the tensional fields (3', 4') such that the crack further propagates in the single crystal, wherein $G(0) \geq 2\gamma_e(0)$ and simultaneously at least one of the following conditions is satisfied:

$$\left|\frac{\partial G}{\partial \alpha}\right|_{\alpha=0} \leq 2\frac{\beta_e}{h} \text{ if } \frac{\partial^2 G}{\partial \alpha^2} \leq 0 \quad (2.1)$$

or $$\left|\frac{\partial G}{\partial \alpha}\right| \leq 2\frac{\beta_e}{h} \forall \alpha : \alpha_1 < \alpha < \alpha_2. \quad (2.2)$$

14 Claims, 8 Drawing Sheets

FOREIGN PATENT DOCUMENTS

| | | |
|---|---|---|
| EP | 0 961 328 A2 | 12/1999 |
| EP | 1 768 181 A1 | 3/2007 |
| JP | 2006-024839 A | 1/2006 |
| WO | WO 93/20015 A1 | 10/1993 |

OTHER PUBLICATIONS

Bechstedt, F., "Principles of Surface Physics", Springer, 2003, pp. 16-18.

R. K. Sink et al., "Cleaved GaN facets by water fusion of GaN to InP", American Institute of Physics, Applied Physics Letter, vol. 68, No. 15, Apr. 8, 1996, pp. 2147-2149.

Belsinger et al., "A Fracture Criterion for Gallium Arsenide Wafers", Engineering Fracture Mechanics, 48(2), 1994, pp. 199-203, 205.

Paterson et al., "On the numerical modelling of laser shearing of glass sheets used to optimize production methods", Proc. Instn. Mech. Engrs., 218(1), Part C: J. Mechanical Engineering Science, 2004, pp. 1-11.

Faber et al., "Crack Deflection Processes-I. Theory", Acta Metallurgica, 31(4), 1983, pp. 565-576.

Hammer et al., "Material related fundamentals of cutting techniques for GaAs wafer manufacturing", Z. Metallkd., 96(7), 2005, pp. 787-793.

* cited by examiner t = t₀
$G_-(\alpha = 0) > 2\gamma_e(\alpha = 0)$ $G_+(\alpha = 0) > 2\gamma_e(\alpha = 0)$

METHOD OF CUTTING SINGLE CRYSTALS

CROSS REFERENCE AND PRIORITY

This application claims the benefit of U.S. Provisional Application 60/996,396, filed Nov. 15, 2007, entitled "Verfahren zum Trennen von Einkristallen", which is hereby incorporated by reference in its entirety. This application further claims the benefit of German Application No. 10 2007 056 115.8, filed Nov. 15, 2007, entitled "Verfahren zum Trennen von Einkristallen", which is hereby incorporated by reference in its entirety.

FIELD OF THE INVENTION

The invention relates to a method of separating single crystals, e.g., single crystalline plates or wafers or parts thereof. In particular, the application relates to a method of dividing single crystals including a crack propagation that is self-adjusting.

TECHNICAL BACKGROUND

Single crystalline wafers comprising semiconducting materials are used as substrates for the manufacturing of micro-electronic components such as field effect or heterobipolar transistors, and of opto-electronic components, such as laser or luminescence diodes. By means of distinct processes such as CVD, MOCVD, LPE, MBE the functional layers are deposited and optionally reworked upon those substrates, or are generated within the substrate by means of ion implantation. These substrates then run through complex structuring processes undergoing multiple applications of exposure masks.

For the purpose of orientation (adjustment) of the exposure masks and optionally for the necessary distinction between a front face and a rear face of the substrate, the substrate comprises a so-called orientation flat (OF) and an identification flat (IF), which is offset with regard to the orientation flat by 90° in the clockwise or counter-clockwise direction. The wafer normal and the surface normal of the flats are generally perpendicular with respect to each other. Conventional manufacturing processes of wafers having flats include the generation of the flats by means of grinding. The adjustment accuracy of the orientation flats with regard to the crystallographic <110>-direction may amount to ±1°, for the identification flat ±5°, in case of a conventional wafer manufacturing, but values even up to ±0.02° may be achieved for the orientation flat employing the above method. Flats manufactured by grinding may comprise mis-orientations fluctuating along the flats as well as chips at the edges, which affect the function of the flats as references for the adjustment of exposure masks. This is particularly valid in the case of manufacturing laser diodes, which necessitate high precision and further undisturbed, sharp-edged flats having an adjustment accuracy of ≦|0.02°| over a length relevant for the respective technology.

It is well-known that the orientation accuracy of the flats can be increased, if these are generated by cleaving the generally brittle semiconductor materials instead of grinding the flats, thereby employing natural cleavage planes. For example, in the case of III-V semiconductors, the {110}-planes are natural cleavage planes. From U.S. Pat. Nos. 5,279,077 and 5,439,723 there are known wafers provided with flats generated by such cleaving accordingly. From U.S. Pat. No. 5,154,333 there is known a cleaving device, which is used to carry out cleavage with a predefined bending stress of a wafer, which contains a seed crack generated by scribing the wafer. However, a disadvantage of the mechanical cleaving device arises in that the crack progress can not be controlled, and in that due to the initialization of the breakage by means of a seed break at the wafer edge a complex fracture mode is realized.

Alternatively there are thermal dividing methods, which deal with a combination of local heating and neighboring local cooling. A basic method relates to a process of cutting flat glass by means of thermally induced stress which is described in DE 28 13 302. According to this method glass is heated in one area and cooled in another area, both areas being provided on the glass on at least one of its two main faces and being placed one after the other on the intended straight cutting line, and further being sharply delineated and symmetric with respect to the cutting line. Temperature gradients result in the glass along the thickness direction and in the direction of the scribe line. The temperature gradients cause thermal stress, which starting from the initial crack at the edge drives a crack perpendicular to the main faces and along the predetermined straight cutting line. Therein the crack progress velocity can be controlled by regulating the applied temperatures and the feeding of the heating and cooling device.

From WO 93/20015 there is known a method of dividing semiconductor components. According to this method the formation of tensile strength in a region between a heating laser beam and a subsequent cooling initiates a breakage. Using this method, the shape, direction, depth and propagation velocity as well as the accuracy of the breakage generated by thermal stress shall be controlled.

One feature of known methods of dividing brittle materials by propagating a crack is the generation or the presence of an initial crack. In the vicinity of the tip of the crack a stress field is generated using a suitable method such as, e.g., the above mentioned mechanical bending stress, or by applying a thermal load. This stress field leads to a complex load at the propagation front of the crack, which may be characterized by a stress-intensity factor K. If the stress field is selected, such that $$K > K_C, \quad (1.1)$$

wherein $K_C$ is the critical stress-intensity factor specific for the material, the crack length increases until the condition $$K \leq K_C \quad (1.2)$$

is fulfilled. $K > K_C$ is the propagation condition of the separation process, which has to be maintained continually or in intervals, until the complete separation is achieved.

The crack propagation proceeds according to the principle of minimizing the free energy of the body that is to be divided. This means, that the crack propagates such that in isotropic materials the mechanical-energy-release rate G becomes a maximum. In anisotropic materials a principle of minimizing the effective surface energy $2\gamma_e$ of the divided surfaces competes with the principle of maximizing the rate of the mechanical energy release when minimizing the total energy of the system during the crack propagation.

$$\frac{dU}{dC} = 2\gamma_e - G \longrightarrow \text{Min} \quad (1.3)$$

wherein U denotes the total energy of the system, and C denotes the surface area generated by means of crack propagation.

This means, that with regard to the above-mentioned methods the propagation of the crack is controlled by the time and position dependent stress fields in the case of isotropic materials. If crystallographic cleavage planes are present, which are characterized by a minimum effective surface energy, the direction of crack propagation enforced by the tensional fields (G→max) competes with the directions of these crystallographic cleavage planes upon crack propagation. As a consequence, employing the above-described methods one is restricted in practice to produce only such cleavage planes, which comprise steps or leaps into neighboring lattice planes. This may exert disadvantageous effects on technologically relevant cleavage surfaces such as resonator surfaces of laser components, or on accuracy of the orientation of cleaved flats.

In theory the production of completely planar cleavage surfaces could be achieved where a planar tensile stress field perpendicular to a desired cleavage plane is generated. In this case the stress fields and the cleavage plane would be coordinated with each other to such an extent that these do not compete with each other. However, these conditions can not be kept in practice. For example, it would have to be required in the case of cleaving laser components, that the wafer must be oriented with high precision with respect to the cleavage device, in order to achieve a sufficient quality of the cleavage plane at least over the length of the laser component. Even with the smallest deviations of the wafer orientation with respect to the generated tensional fields, steps formed on the cleavage plane will become inevitable.

SUMMARY OF THE INVENTION

It is an object of the invention, to provide a method of dividing single crystals, which avoids the above mentioned disadvantages and which secures exact cleavage planes over a full distance up to the complete separation of the desired parts.

The object is solved by a method according to claim 1, or by a single crystal according to claims 13 or 14. Embodiments and aspects of the invention are set forth in the dependent claims.

According to the invention, cleavage planes having accuracies in the range of $\leq |0.02°|$, $|0.01°|$, $|0.005°|$ or even less than $|0.001°|$—as measured over the extent of the respective area relevant for the technology or a plurality of portions thereof—can possibly be obtained. The area relevant for the respective technology corresponds in the case of laser diodes for example with a length of a laser resonator, or in the case of integrated circuits with the edge length of a chip to be separated. Upon separation of material in order to form flats it corresponds to the flat length. Also, the manufacturing of a natural cleavage plane along the crystallographic grid plane becomes possible due to the self-adjusted cleaving proposed herein.

The orientation accuracy of a separation surface of the single crystal with respect to a crystallographic grid plane is measured by aligning the crystal with a reference face, wherein at least two points of the separation surface abut on the reference face. Using an X-ray goniometer the orientation of the crystallographic grid plane can then be determined with respect to this reference plane. The grid plane orientation is then related to the reference surface plane resulting in an angle difference, which herein represents the accuracy.

The orientation of the separation surface with respect to the reference surface according to the method used for determining the grid plane orientation can also be obtained by following different approaches as compared with the above described mechanical abutment, e.g., by applying optical methods.

Besides the determination of the global orientation differences of the cleavage surface obtained according to this method using a length relevant for the present technology, a local orientation difference can also be obtained by subdividing this technologically relevant surface length into portions of, e.g., 2 mm and performing the orientation measurement using for example an optical microscope, a miniature interferometer, a white light interferometer or an autocollimator. The orientation accuracy then corresponds to the largest of these measured local differences.

The cleavage planes that may be obtained according to certain embodiments of the present invention are distinguishable as such from surfaces of semiconductor plates having another orientation when known measurement methods are applied such as the LEED method (low energy electron diffraction), cf. Qian, G. X., Martin, R. M., Chadi, D. J., in Phys. Rev. B, Vol. 37, p. 1303. (1988), or Bechstedt, F. "Principles of Surface Physics", Springer Verlag, Berlin, ISBN 978-3-540-00635-0, Chapter 1.2.4; pages 16-18. Thereby it is taken advantage of the fact that natural cleavage planes of III-V-semiconductors show merely a relaxed, but no reconstructed arrangement of atoms near the surface, which latter is the case for other orientations.

The method has the advantage that the previous determination and adjustment of the crystallographic cleavage planes for the cleavage device are required only with common accuracies. The precise orientation of the propagating crack is facilitated by the process conditions according to certain embodiments of the invention, which enforce a self-adjustment of the direction of crack propagation in precisely one of the crystallographic cleavage planes without steps or jumps.

BRIEF DESCRIPTION OF THE DRAWINGS

Further advantages and effects become evident from the description of an embodiment taken in conjunction with the Figures. In the Figures.

DETAILED DESCRIPTION OF EMBODIMENTS

In the following the invention is described by means of an embodiment of a cleaving process of a GaAs-Wafer by means of thermally induced stress fields. At first, the wafer is provided to the cleavage device. The adjustment of the wafer with respect to the cleavage device is performed by virtue of a previously formed marking, e.g., a short flat, which by means of example is grinded and oriented by means of X-ray diffractometry. Thereby an accuracy of the flat orientation with respect to the {110}-cleavage plane of 0.1° can be achieved in practice. Similarly, other markings or short flats perpendicular or in a predetermined relation to the cleavage planes may be considered as pre-adjustment means. The pre-adjustment with respect to the movement direction may be carried out with the help of stops or employing optical methods.

Figure 1:
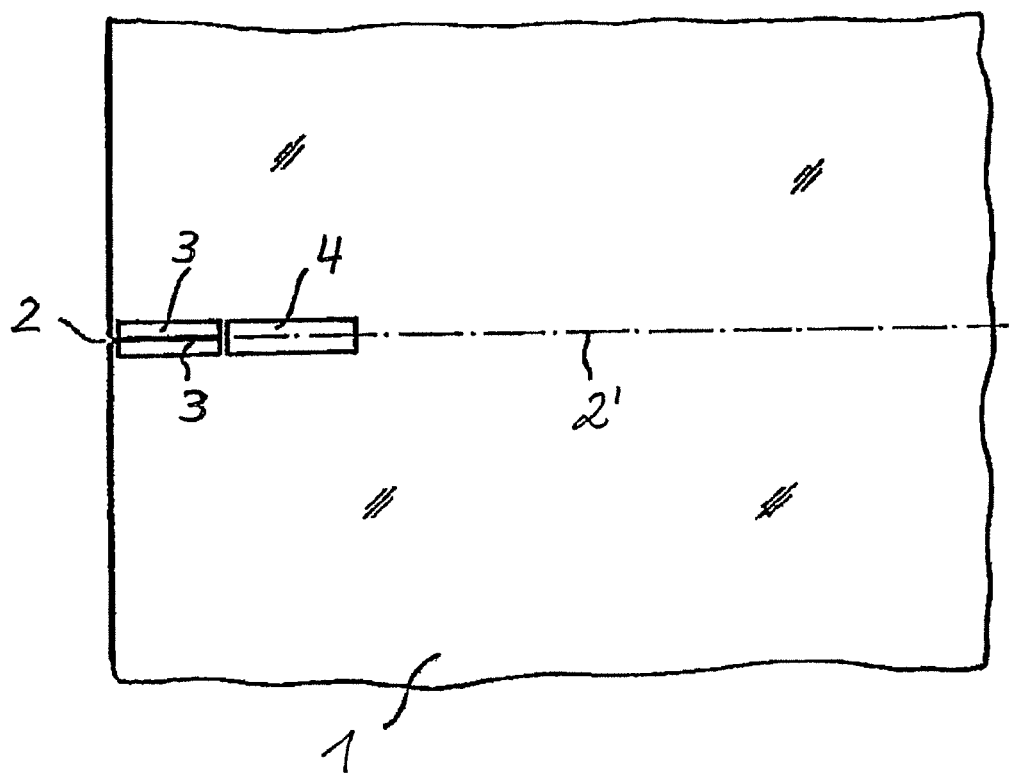
FIG. 1 shows a schematical top view of a wafer to be cleaved.

As becomes schematically evident from FIG. 1, an initial crack 2 is formed in a {110}-cleavage plane of the GaAs-wafer 1. Ideally, the initial crack 2 is formed in a cleavage plane which is parallel to a preferred gliding direction of the $\alpha$-dislocations.

The initial crack 2 is for example generated by an indenter with defined geometry (Vickers, Knoop-indenter). Similarly, other geometries or a scoring of the surface are possible. By proper selection of the indentation load and geometry the formation of B-cracks perpendicular thereto can be avoided.

Due to thermally induced stress fields, a plane edge-crack extending to the wafer backside is generated from the indentation-induced crack in the {110}-cleavage plane. This edge-crack serves as a plane initial crack for the further crack propagation, or for the desired cleavage direction, or for the cleavage plane 2', respectively. Herein, the thermally induced stress fields are dimensioned, such that the initial crack can not yet propagate further in this phase.

Thereafter, a stress intensity K is generated for the purpose of crack propagation, and the quantity $G(\alpha)$ is determined, which represents the rate of energy release upon further crack propagation in dependence of a deflection of the crack from the cleavage plane about an angle $\alpha$. The crack propagation may be regarded as a superposition of a twist (twist configuration) about the angle $\phi$ around an axis perpendicular to the crack front of the initial crack and a rotation about an angle $\theta$ around an axis in the crack front of the initial crack (tilt configuration). Both cases can be considered separately. The described method according to the invention is valid for both cases, such that for further consideration it is sufficient to refer to a deflection angle $\alpha$ (with $\alpha=\theta$ for the tilt configuration and $\alpha=\phi$ for the twist configuration). The embodiment is detailed with regard to the example of the tilt-configuration without restricting the validity of the general case. The stress intensity K is generated by employing known methods such as for example the method according to DE 28 13 302 or the method according to WO 93/20015. Therein, one or more heat sources 4 as well as one or more heat sinks 3 (cf. FIGS. 11, 12, 14) are localized on one or both wafer faces, such that ideal symmetrical stress fields are obtained with respect to the wafer thickness as well as with respect to the desired cleavage direction. The heat sources can be generated for example by absorption of laser light, and the heat sinks can be generated by an application of cooling aerosols such as described for example in WO 93/20015. Similarly, other variants are possible as well. The heat sources and heat sinks are controlled and positioned such that a crack propagation is enabled. The temperature has to be sufficiently low in order to avoid plastic deformations. For GaAs a temperature of less than about 300° C. is considered as being appropriate.

The dimensioning or control, or even a feedback control, of the stress fields is carried out, such that crack propagation occurs continually or in intervals, wherein crack propagation is characterized by $G(0) \geq 2\gamma_e(0)$. According to certain embodiments of the invention the dimensioning or control of the stress fields is performed such that at least one of the following conditions is satisfied:

$$\left|\frac{\partial G}{\partial \alpha}\right|_{\alpha=0} \leq 2\frac{\beta_e}{h} \text{ if } \frac{\partial^2 G}{\partial \alpha^2} \leq 0 \qquad (2.1)$$

or $$\left|\frac{\partial G}{\partial \alpha}\right| \leq 2\frac{\beta_e}{h} \forall \alpha : \alpha_1 < \alpha < \alpha_2. \qquad (2.2)$$

Herein, the symbols denote:
$\alpha$ possible deflection angle upon crack propagation from the cleavage plane
$\alpha_1, \alpha_2$ range of angles, in which the necessary condition for a crack propagation (1.1) is satisfied
$G(\alpha)$ mechanical-energy-release rate in dependence of a deflection of the crack from the cleavage plane about angle $\alpha$.
$\gamma_e(0)$ effective surface energy of cleavage surface
$\gamma_e$ effective surface energy depending on direction
$\beta_e$ effective step energy (material specific)
$h$ step height (material specific).

The effective free surface energy $\gamma_e$, which is used in fracture mechanics, is determined in breakage experiments from a relation between fracture strength and crack length. This quantity further contains—as compared with the intrinsic surface energy $\gamma_s$—energy portions of dissipative processes. To these belong—among others—the formation of dislocations in the process zone or plastic zone, the emission of acoustic energy or the occurrence of dissipative structures (fracture structures) at the fracture surfaces. Hence, the surface energy $\gamma_e$ is larger than the intrinsic surface energy $\gamma_s$.

For the specific free step energy the following approximation may be found regarding thermo-dynamic equilibrium:

$$\beta_e = -nk_B T \ln \eta(1+2\eta),$$

$$\eta = \exp(-\epsilon/k_B T).$$

Therein n denotes the step density with $n=1/a$, $k_B$ denotes the Boltzmann constant, $\epsilon$ denotes the binding energy between closest neighbours in the crystal lattice, and a denotes the distance between building units within the step.

The binding energy $\epsilon$ can be estimated from the sublimation energy $\Delta H_{sub}(T)$ of the crystal ("congruent vaporization") and the coordination number Z of the considered crystal:

$$\epsilon \approx \Delta H_{sub}/Z,$$

wherein $\Delta H_{sub}(T)$ is obtained from a calculation of the thermo-dynamic equilibrium $X_s \leftrightarrow X_g$ with the thermo-dynamic data of the solid (s) and the gaseous (g) phase X.

The free step energy can also be determined experimentally.

For GaAs following values can be assumed:

The effective free surface energy of GaAs {110}-cleavage surfaces obtained from fracture experiments yields $\gamma_e(0) \approx (0.86 \pm 0.15)$ J/m². By investigation of the vicinity of the cleavage front, it could be ensured that dissipative processes can be neglected, i.e., the measured effective free surface energy approximates the intrinsic surface energy $\gamma_s(0) \approx 0.82$ J/m², the latter being deduced from crystal growth.

For GaAs {110}/<001>, i.e., <001> oriented steps on a {110}-cleavage surface with a tilting axis parallel to the <001> vector, the step energy has been estimated with the following data:

$\Delta H_{sub}(300 \text{ K}) = 451.4 \text{ kJ/mol}$, $Z = 4$ $\rightarrow \epsilon \approx 1.17$ eV;

and for T=300 K: $\eta \approx 45.25$.

The distance of atoms in a step parallel to the <001>-vector amounts to $a_0 = 0.565325$ nm, while the height of a double step amounts to $h = a_0/\sqrt{2} = 0.399$ nm. As a result of the above formula, the free step energy becomes:

$\beta_e \approx 3.31 \cdot 10^{-10}$ J/m, and $\beta_e/h \approx 0.83$ J/m².

This value approximately agrees with the intrinsic free surface energy $\gamma_s \approx 0.82$ J/m² of a {110}-cleavage plane.

For the free step energy the same conclusions as for the surface energy may analogously be derived. The effective step energy experimentally derived can be larger than the step energy estimated herein due to dissipative portions. By indicating the theoretically obtained step energy, the right side in conditions (2.1) and (2.2) is known.

Stress fields can be calculated obeying the conditions of the heat sources and sinks by employing simulation calculations. But also direct measurement of the stress is possible, for example via stress birefringence, ultrasonic microscopy, micro-Raman-spectroscopy etc. Thereof, the mechanical-energy-release rate G is calculated for the preset stress field in dependence from possible deflections of the crack about angle α. By controlling and positioning the heat sources and sinks, the stress fields are adjusted, such that the above mentioned conditions are satisfied.

Thereby, an angular range $\alpha_1 < \alpha < \alpha_2$ exists, in which the condition $G \geq 2\gamma_e$ is satisfied. This range depends on the stress fields and the material characteristics as well as on the mis-orientation of the employed cleavage device from the targeted cleavage plane. In the angular range between $\alpha_1$ and $\alpha_2$ the necessary condition (1.1) for the crack propagation is satisfied. The control according to the certain embodiments of the invention, or the dimensioning of the stress intensity K aiming at a compliance with conditions (2.1) or (2.2) facilitates, that the crack is not deflected in the angular range $\alpha_1 < \alpha < \alpha_2$, rather it moves over the complete separation distance within the targeted cleavage plane.

The unavoidable mis-orientation of the cleavage device, i.e. a stress intensity K with mixed crack opening modes $K_I + K_{II} + K_{III}$, causes a mechanical-energy-release rate $G(\alpha)$ which is unsymmetrical with respect to the desired crack propagation direction in the cleavage plane $\alpha = 0$ in dependence from possible deflection angles α. Further, the crack propagates in a direction, in which the quantity $g = G - 2\gamma_e$ becomes maximum. The control or the dimensioning of the stress intensity K respectively, aiming at a compliance with the conditions (2.1) or (2.2) guarantees, that even in the case of a mis-orientation of the cleavage device, or in case of a stress intensity K with mixed crack opening modes $K_I + K_{II} + K_{III}$, a maximum of the quantity g is always obtained at $\alpha = 0$. Hence, the crack propagation is enforced in a desired lattice plane by self-adjustment of the crack propagation direction. As a result, the cleavage surfaces having a high orientation accuracy in the range of at least $\leq |0.01°|$, $\leq |0.005°|$ or even $\leq |0.001°|$ can be generated. Further, cleavage surfaces having a minimum step density, ideally without steps, can be produced within the complete technologically relevant area (flats, resonator surfaces, etc.).

Figure 2:
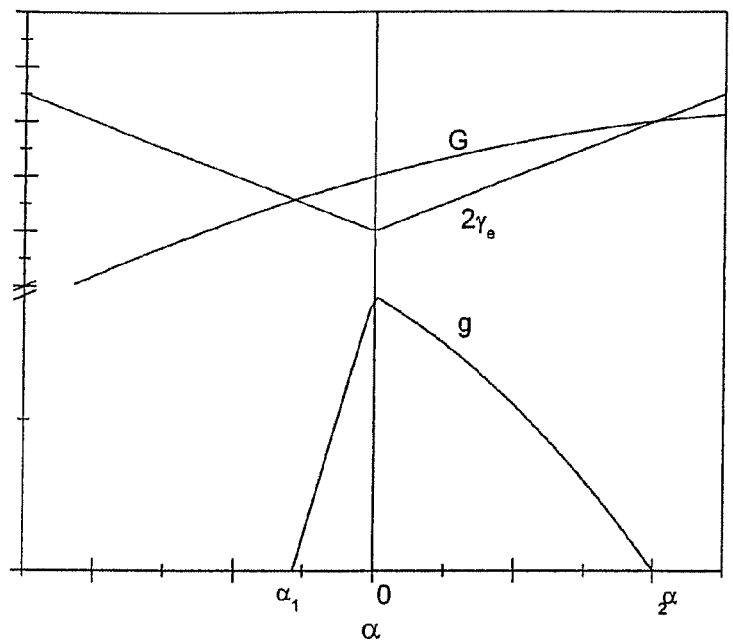
FIG. 2 shows the mechanical-energy-release rate G and the effective surface energy $2\gamma_e$ upon compliance with a first condition.
Figure 3:
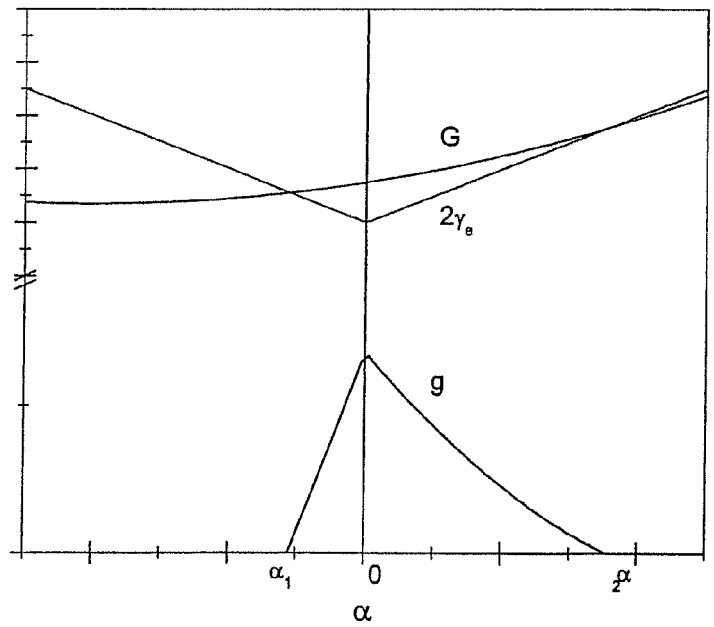
FIG. 3 shows the mechanical-energy-release rate G and the effective surface energy $2\gamma_e$ upon compliance with a second condition.

Two situations, in which the conditions according to certain embodiments of the invention are satisfied, are illustrated in FIGS. 2 and 3.

FIG. 2 shows the energy release rate G and the effective surface energy $2\gamma_e$ as well as $g = G - 2\gamma_e$ under compliance with the condition $$\left|\frac{\partial G}{\partial \alpha}\right|_{\alpha=0} \leq 2\frac{\beta_e}{h} \text{ and } \frac{\partial^2 G}{\partial \alpha^2} \leq 0 \forall \alpha : \alpha_1 < \alpha < \alpha_2.$$

FIG. 3 shows the energy release rate G and the effective surface energy $2\gamma_e$ as well as $g = G - 2\gamma_e$ under compliance with the condition $$\left|\frac{\partial G}{\partial \alpha}\right| \leq 2\frac{\beta_e}{h} \forall \alpha : \alpha_1 < \alpha < \alpha_2.$$

Using the method, surfaces such as for example flats having an orientation accuracy of 0.01°—as measured over the surface range relevant for this technology—can be applied to a wafer, i.e., an accuracy commonly achieved in practice by a grinding process can be increased by one order of magnitude. The method ensures that the adjustment accuracy between the movement direction and the cleavage plane of 0.1° is sufficient in order to constrain the crack propagation in the cleavage plane with an accuracy of $\leq 0.01°$. First results show that accuracies of even $\leq 0.005°$ or $\leq 0.001°$ may be obtained. Finally, a completely stepless ideal cleavage surface can be obtained which extends precisely along the natural crystallographic plane.

Figure 4:
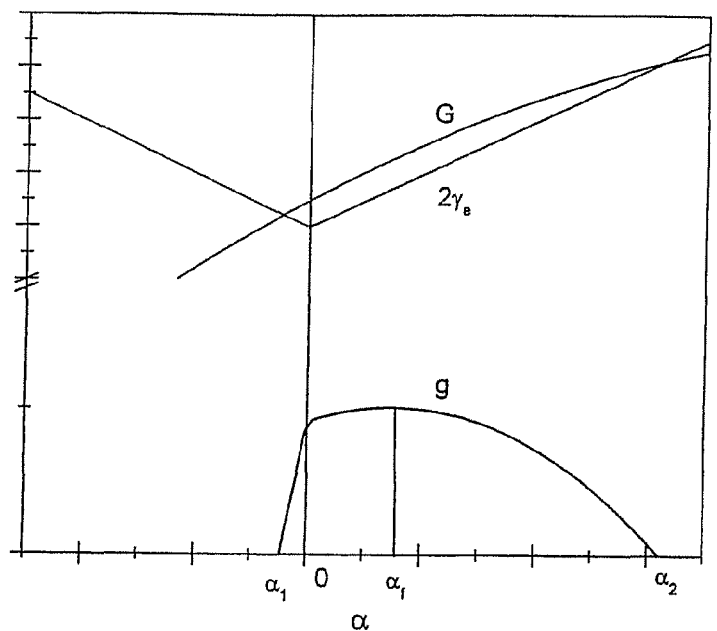
FIG. 4 shows the mechanical-energy-release rate G and the effective surface energy $2\gamma_e$ upon compliance with a third condition.
Figure 5:
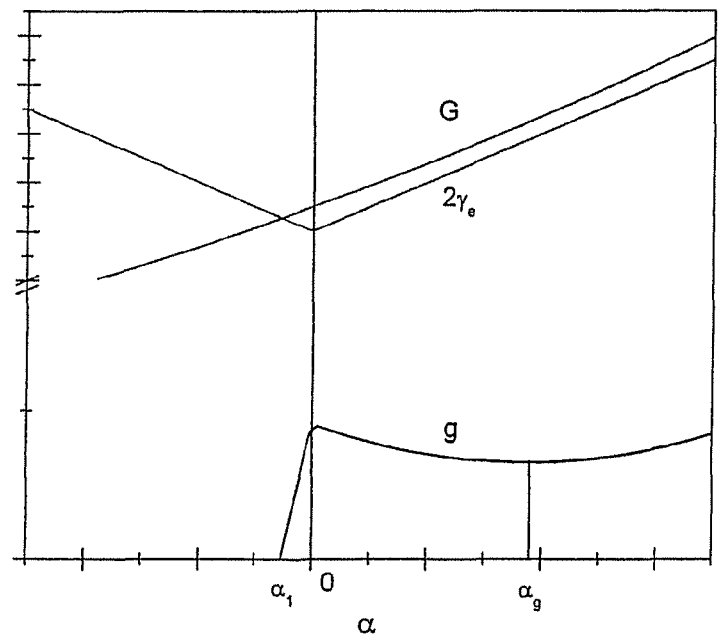
FIG. 5 shows the mechanical-energy-release rate G and the effective surface energy $2\gamma_e$ upon compliance with a fourth condition.

FIGS. 4 and 5 show situations, in which the mis-orientation of the cleavage device, or a stress intensity K with mixed crack opening modes is present and the conditions according to certain embodiments of the invention are not satisfied.

FIG. 4 illustrates the energy release rate G and the effective surface energy $2\gamma_e$ as well as g=

$$G - 2\gamma_e \text{ with } \left|\frac{\partial G}{\partial \alpha}\right|_{\alpha=0} > 2\frac{\beta_e}{h}.$$

In FIG. 4 the crack propagation occurs at $\alpha = \alpha_f$ i.e. the crack deviates from the desired cleavage direction $\alpha = 0$. On the correspondingly generated surface, steps and curved surface areas are produced. The orientation accuracy of the technologically relevant areas (flats, resonator surfaces) is not sufficient and of less quality than desired.

FIG. 5 shows the energy release rate G and the effective surface energy $2\gamma_e$ as well as g=G−

$$2\gamma_e \text{ with } \left|\frac{\partial G}{\partial \alpha}\right| > 2\frac{\beta_e}{h} \text{ for } \alpha > \alpha_g.$$

In FIG. 5 the crack propagation at $\alpha=0$ is unstable. Upon exceeding the angle $\alpha \geq \alpha_g$ a deviation of the crack propagation from the desired plane $\alpha=0$ occurs.

Figure 6:
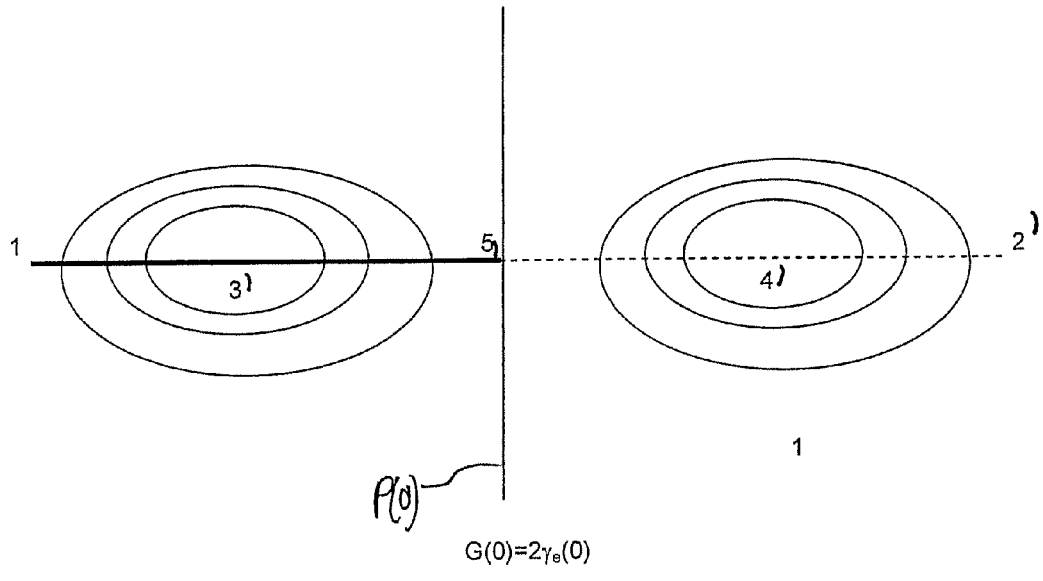
FIG. 6 shows a first phase of crack propagation.
Figure 7:
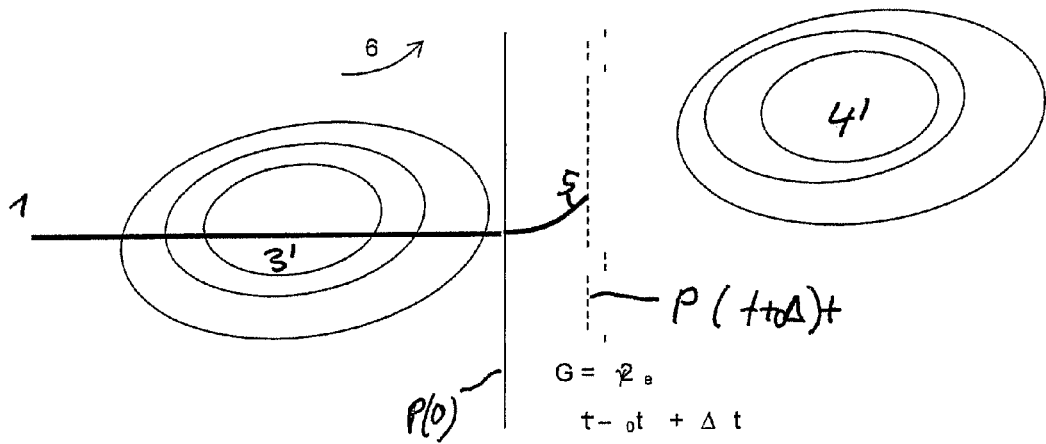
FIG. 7 shows a second phase of crack propagation, which is controlled by the relative movement of the stress fields (e.g., in isotropic materials)

FIGS. 6 to 9 show different cases of crack propagation in the wafer. By controlling and positioning the heat sources and heat sinks, a compression stress maximum 4' and a tensile stress maximum 3' is generated. The heat sources and sinks are positioned such as to locate the compression stress maximum 4' in front of the crack tip 5 in the propagation direction, and the tensile stress maximum 3' behind the crack tip 5, as shown in FIG. 6. Within the range between the tensile stress and compression stress maxima, the condition $K=K_C$ or $G=2\gamma_e$ is satisfied at time step $t=t_0$ at a predetermined position P(0). By a relative movement between the temperature fields and the wafer, which is shown in FIG. 7 by the arrow 6, the conditions (1.1) $K>K_C$ or $G>2\gamma_e$, or (1.2) $K \leq K_C$ or $G \leq 2\gamma_e$ can be controlled. I.e., the crack tip 5 can be advanced, stopped or further moved as desired. The relative movement can be carried out by a movement of the heat sources and heat sinks (laser focus or cooling nozzles, respectively), or it can be carried out by a movement of the wafer, or it can be carried out by a combination of both. Dissipative or dynamical effects can be avoided by controlling the propagation velocity. The propagation velocity can be selected to sufficiently small values, such that a quasi static crack propagation at thermo-dynamic equilibrium can be assumed (v<<⅓ of the sound velocity). The crack propagation follows the relative movement 6 between the stress fields and the wafer 1. This is utilized in prior art, in order to cut complicated geometries, which may be straight or curved.

Figure 8:
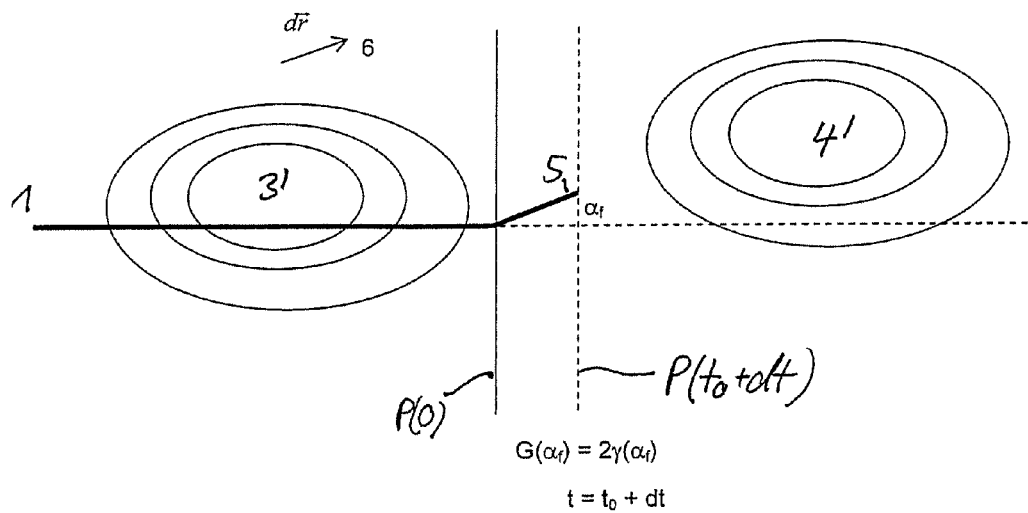
FIG. 8 shows a phase of crack propagation in the case of a deviation from the desired cleavage direction when a crystallographic cleavage plane is present and when the stress fields are asymmetrically adjusted with respect to the cleavage plane.

If crystallographic cleavage planes are present the influence of the cleavage planes competes with the influence of the stress fields 3' and 4' during the relative movement 6 between the tensional fields and the wafer, as described above, or the cleavage direction 2' competes with the movement direction 6 of the device during the growth of the crack. The situation is depicted in FIG. 8. At an infinitesimal relative movement 6 by $d\vec{r}$, the crack is generally deviated due to the energy principle (1.3) by angle $\alpha_f$. This corresponds to the situation shown in FIG. 4. The tip of the crack is located at the position $P(t_0+dt)$, where the condition $G(\alpha_f)=2\gamma_e(\alpha_f)$ is achieved after time $t=t_0+dt$ (quasi static crack propagation). In this manner undesired steps are generally created on the cleavage surfaces, or deviations from the desired cleavage direction occur.

Figure 9:
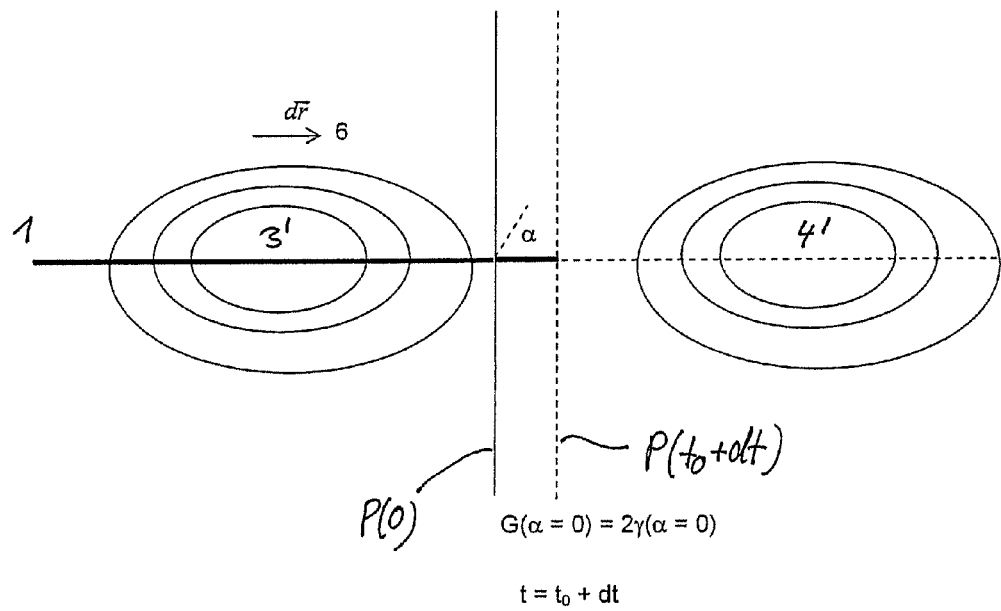
FIG. 9 shows a phase of crack propagation in a desired cleavage direction in the case of an ideal symmetrical adjustment of the stress fields with respect to the cleavage plane.

In order to avoid the competition between the cleavage direction and the stress fields, maximum values of the tensile stress should—according to known fracture mechanical principles—be directed perpendicularly to the desired cleavage plane. In order to achieve this situation appropriately, an ideally symmetrical adjustment of the tensional fields 4' and 3' (i.e., the heating source and sink) would have to be provided relative to the cleavage plane. This adjustment also has to be maintained during the complete separation process, i.e. over the full distance of the cross-section of the GaAs-wafers. This means that the movement direction 6 of the device has to be adjusted ideally parallel to the cleavage plane 2' as well as to the symmetry line of the tensional fields. This situation is depicted in FIG. 9. After a relative movement by $d\vec{r}$ the crack tip remains at a position $P(t_0+dt)$ at which the condition $G(0)=2\gamma_e(0)$ is reached after a time $t=t_0+dt$. This means that the crack fully extends within the cleavage plane. This ideal situation is, however, not achievable in practice. This would require the measurement and adjustment of the cleavage plane with respect to the heating sources and sinks as well as with respect to the movement direction of the device with very high precision, which can not be achieved from the viewpoint of present production techniques and economics. Using the certain embodiments of the invention, however, a surface is generated which is oriented with very high accuracy.

Figure 10:
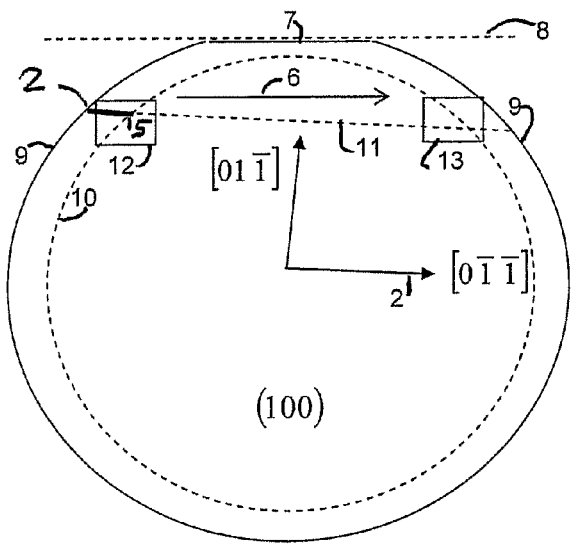
FIG. 10 shows a schematical representation of the orientation of a GaAs-wafer in the cleavage device.

FIG. 10 shows the orientation of the GaAs-wafer 1 in the cleavage device. As described above, a marking or short flat 7 is commonly present, which is grinded with a predetermined orientation tolerance with respect to the crystallographic directions. Thereby, under practical circumstances and with justifiable efforts an accuracy of the flat orientation 8 with respect to the {110}-cleavage planes of 0.1° is achievable. The flat 7 is pre-adjusted with respect to the movement direction 6 of the relative movement between the stress fields and the wafer. Applying the separation method according to certain embodiments of the invention, a surface (flat) is formed on the wafer having an orientation accuracy of $\leq |0.01°|$. I.e., the accuracy, which in practice can be achieved using a grinding process, has been increased by an order of magnitude. The method according to certain embodiments of the invention facilitates that the adjustment accuracy between the movement direction 6 and the cleavage plane 2' of 0.1° suffices to constrain the crack propagation within the cleavage plane to an accuracy of at least ±0.01°. This can be continued from a wafer edge 9 to an opposed wafer edge 9, or there may be present a predetermined region 10, within which the requirements to orientation accuracy of the flat 11 to be generated have to be fulfilled. The size and geometry of this region 10 may vary and depends on different technological requirements. Accuracies of $\leq 0.005°|$ or even $\leq 0.001°|$ are also possible as well as a precisely stepless cleaving along the crystallographic plane.

Figure 11:
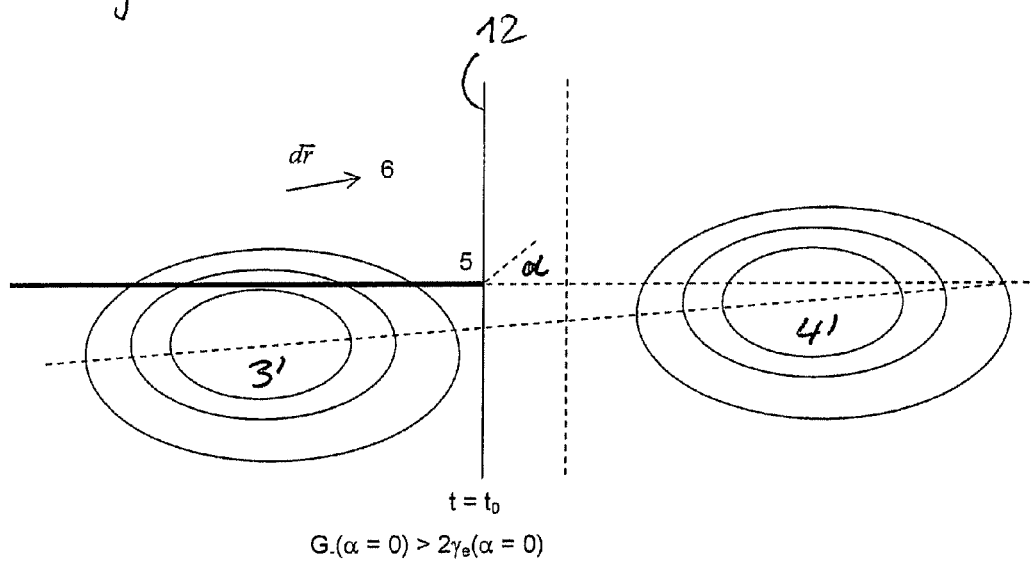
FIG. 11 shows an example of the maximum error consisting of a deviation of the position and direction between the desired cleavage plane and the movement direction as well as the generated stress fields in the start region.
Figure 12:
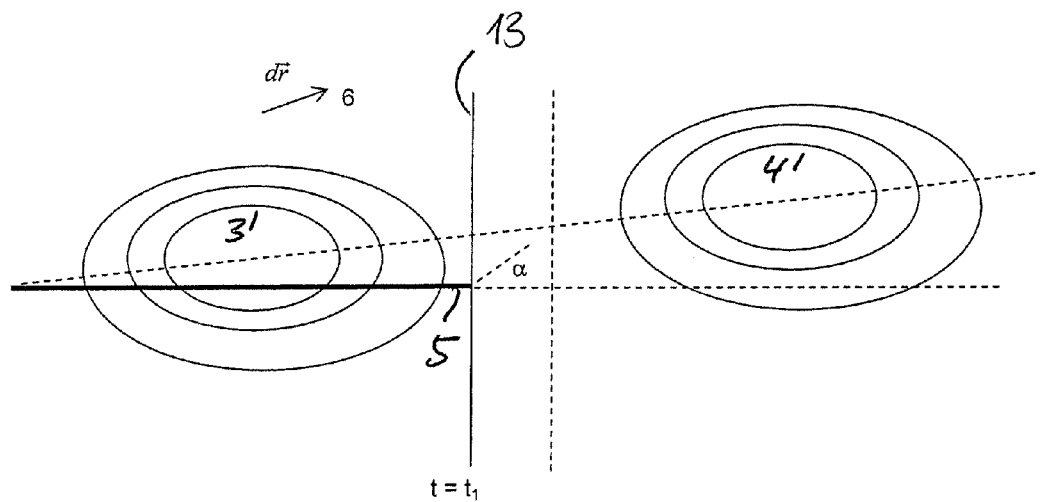
FIG. 12 shows an example of the maximum error consisting of a deviation of the position and direction between the desired cleavage plane and the movement direction as well as the generated stress fields in the target region.

By simulation calculations carried in advance, the stress fields are calculated, preferably with the selected conditions with regard to the heating sources and sinks. The simulation is carried out in the regions at the preset start and target points of the dividing process. This can be done for example at the edges of the technologically used region 10 within areas 12 and 13. Therein, the initial crack 2 within the cleavage plane at the edge of the start area 12 is present according to the above mentioned methods, preferably outside of region 10. Also other positions are possible. The proportions of FIG. 10 are not drawn to the scale and are shown exaggeratedly for illustration purposes. The hitherto known measurement accuracies (for example in X-ray diffractometry), the known tolerances with regard to grinding and the known positional accuracies determine the maximum error upon pre-adjustment of the wafer. For example, it is possible to determine with the help of simple geometrical relations the maximum error between position and direction of the desired cleavage plane and the movement direction 6 and also relative to the generated tensional fields 3' and 4' in the start and target areas 12 and 13 of the separation process. FIG. 11 shows an example of the maximum error in the start area 12. FIG. 12 shows an example of the maximum error in the target area 13. Note that also mirrored positions are possible.

Now, the mechanical-energy-release rate G can be calculated for the case of infinitesimal crack propagation in dependence from possible deflections about the angle $\alpha$ for the given stress fields in the start position 12 of the crack tip 5 of the initial crack. The same can be calculated in the planned target area 13 under the assumption that the crack has not left the cleavage plane 2'. As a result there arise two functions $G_-(\alpha)$ and $G_+(\alpha)$, which are given by the known maximum error in the start and target positions. The true function $G(\alpha)$ is not known, but represents a state between $G_-(\alpha)$ and $G_+(\alpha)$. By dimensioning and positioning the heating sources and sinks the stress fields are arranged, such that the conditions according to certain embodiments of the invention $$\left|\frac{\partial G}{\partial \alpha}\right|_{\alpha=0} \leq 2\frac{\beta_e}{h} \qquad (3.1.)$$

and $$\frac{\partial^2 G}{\partial \alpha^2} \leq 0 \qquad (3.2)$$

are fulfilled for both functions $G_-(\alpha)$ and $G_+(\alpha)$. Thereby it is ensured that for each intermediate state $G(\alpha)$ the conditions according to certain embodiments of the invention are satisfied as well, and the crack remains within the cleavage plane during the complete dividing process.

Figure 13:
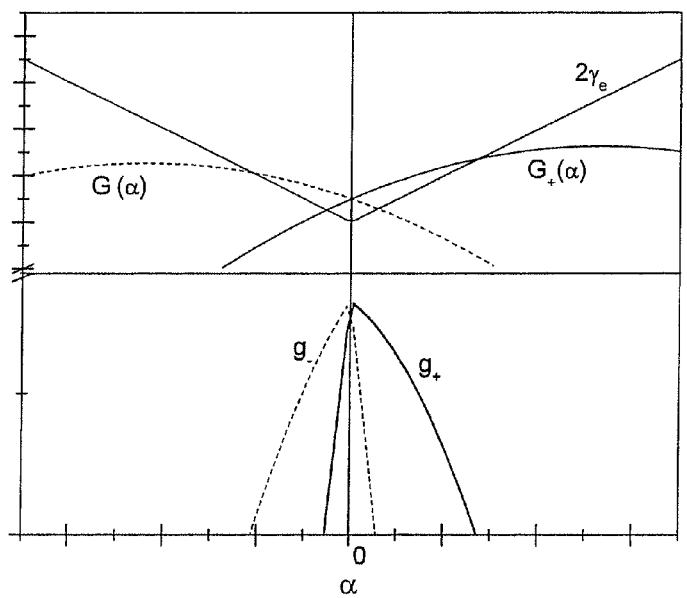
FIG. 13 shows the mechanical-energy-release rates $G_-$ and $G_+$ in the start- and target regions in dependence of angle $\alpha$.
Figure 14:
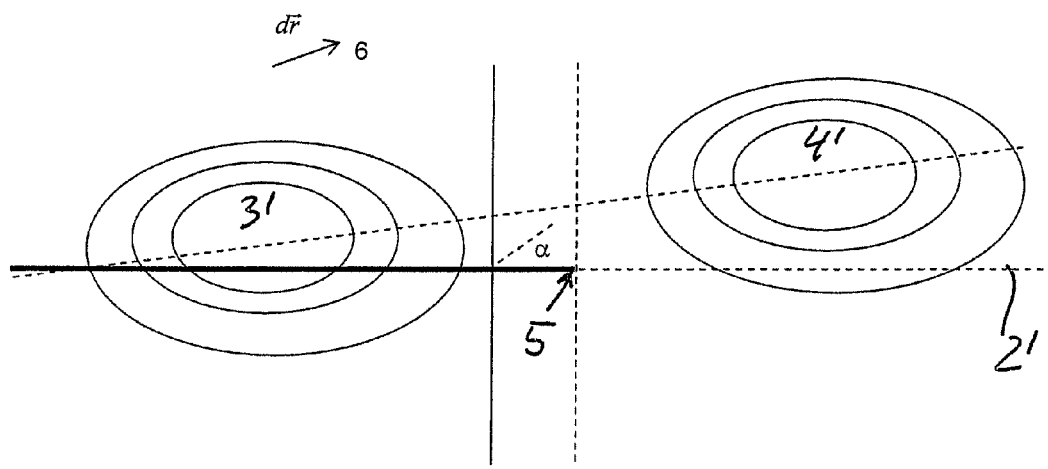
FIG. 14 shows a phase of crack propagation under compliance with certain conditions.

FIG. 13 shows an example of a balanced situation. When complying with the condition according to certain embodiments of the invention for both functions $G_-(\alpha)$ and $G_+(\alpha)$ the function g has its maximum also in any possible (not known) intermediate states during the separation process at $\alpha=0$, and a self-adjustment of the crack within the cleavage plane is ensured for the complete separation process between the start and target position. A deflection of the crack as shown in FIG. 7 is impeded and the crack tip moves in any time step $t=t_0+dt$ of the separation process in the cleavage direction $\alpha=0$ as shown in FIG. 14.

The calculation of the functions $G_-(\alpha)$ and $G_+(\alpha)$ and the balancing of the stress fields can also be carried out iteratively as well as for all possible combinations of known maximum errors due to pre-adjustment. The control and dimensioning of the stress fields is in simple fashion possible for example by control of the laser power and/or the variation of laser focus and/or the arrangement of cooling nozzles relative to the laser spot using the known methods. Nevertheless, further alternatives may equally be considered.

The invention can further be carried such that during the step of testing the conditions (2.1) or (2.2) a maximum admissible range of angles $\alpha_1 < \alpha < \alpha_2$ is determined. In this range $$\frac{\partial^2 G}{\partial \alpha^2} \leq 0$$

must be valid for condition (2.1), or $G(\alpha) \geq 2\gamma_e(\alpha)$ must be valid for condition (2.2), respectively. The determined angular range is then compared with a predetermined mean alignment- or adjustment-error of an orientation of the crystallographic (2') relative to the separation device. The control of the stress fields (3', 4') and/or the adaption of the pre-adjustment of the crystal is then carried out in dependence of the result of the comparison.

The invention is not limited to the separation of GaAs-wafers, which are described herein as an embodiment. Rather, the invention may also be applied to any single crystal. Approximated values for a $CaF_2$ (111)-plane are for example $\gamma_s \approx 0.47$ J/m$^2$ (ab initio Hartree-Fock calculation) and $\beta_e \approx (3.31-6.8) \times 10^{-10}$ J/m and with h=0.32 nm: $\beta_e/h \approx (1.03-2.13)$ J/m$^2$.

Further, the invention is also applicable to single crystals, which are formed as single crystalline layers on a single crystalline substrate. The layer and the substrate can thereby be formed from the same or a different material composition.

In the above embodiments, a specific arrangement of the stress fields has been described. Therein, the propagation of the crack is maintained within a stress filed between the temperature sink and the temperature source. The invention is, however, not restricted to that specific arrangement. For example, the stress fields can also be provided by the mere presence of a temperature sink or alternatively of a temperature source, and/or the propagation front is maintained in front of the sink and/or source and not behind one of them or between both.

The invention can further be embodied as a computer program product, which is arranged to perform and control the steps provided in the appended method claims.

The invention claimed is:

1. A method of separating single crystals, particularly of plates, wafers or parts thereof, comprising:
    pre-adjusting a crystallographic cleavage plane relative to a cleavage device;
    determining a stress intensity using at least one stress field;
    for the at least one stress field, determining an energy release rate $G(\alpha)$ dependent on a possible deflection angle from the cleavage plane upon crack propagation in a single crystal;
    generating the at least one stress field, wherein $G(0) \geq 2\gamma_e(0)$ and simultaneously at least one of the following conditions is satisfied:

$$\left|\frac{\partial G}{\partial \alpha}\right|_{\alpha=0} \leq 2\frac{\beta_e}{h} \text{ if } \frac{\partial^2 G}{\partial \alpha^2} \leq 0 \qquad (2.1)$$

or $$\left|\frac{\partial G}{\partial \alpha}\right| \leq 2\frac{\beta_e}{h} \forall \alpha: \alpha_1 < \alpha < \alpha_2, \qquad (2.2)$$

wherein:
    $\alpha$ denotes the possible deflection angle from the cleavage plane upon crack propagation,
    $\alpha_1$, $\alpha_2$ denotes a range of angles, in which the necessary condition for a crack propagation $G(\alpha) \geq 2\gamma_e(\alpha)$ is satisfied,
    $G(\alpha)$ denotes the mechanical-energy-release rate dependent on a deflection of the crack from the cleavage plane about angle $\alpha$,
    $\gamma_e(0)$ denotes an effective surface energy of cleavage surface,
    $\gamma_e$ denotes an effective surface energy which depends from the direction,
    $\beta_e$ denotes an effective step energy (material specific), and
    h denotes a step height (material specific).

2. The method according to claim 1, wherein the step of controlling or regulating the stress fields includes the following steps:
    verifying the validity of $G(0) \geq 2\gamma_e(0)$ and the at least one of the conditions (2.1) or (2.2) for the energy release rate $G(\alpha)$ obtained for the given stress fields dependent on possible deflection angles ($\alpha$);
    dependent on the result of the verification, adjusting the stress fields or the pre-adjustment of the cleavage plane relative to the cleavage device.

3. The method according to claim 1, wherein
the step of determining the energy release rate $G(\alpha)$ for the adjusted stress fields or the adapted pre-adjustment as well as the following step of the verification are repeated, if at least $G(0) \geq 2\gamma_e(0)$ or the at least one of the conditions (2.1) or (2.2) is not fulfilled; and
the stress fields or the pre-adjustment are adjusted in response thereto.

4. The method according to claim 1, wherein an initial crack is generated as a continuous edge-crack directed along the cleavage plane.

5. The method according to claim 1, wherein the stress intensity (K) is generated thermally or mechanically.

6. The method according to claim 1, wherein, in advance:
the energy release rate (G) is determined depending on the angle ($\alpha$) via simulation calculations; and/or
the material specific step energy ($\beta_e$) and the material specific step height (h) are determined and preset; or
the direction dependent effective surface energy ($\gamma_e$) is determined and preset.

7. The method according to claim 1, wherein
a simulation or calculation of the stress fields is performed in advance for at least one of a number of positions of the crack along its propagation path across the single crystal prior to generating at least one of the stress fields.

8. The method according to claim 1, wherein
the stress fields in the vicinity of a tip of the crack are measured during the propagation of the crack; and
the measured stress fields are thereafter preset for the step of determining the energy release rate $G(\alpha)$ dependent on possible angular deflections ($\alpha$).

9. The method according to claim 1, wherein
the stress fields are measured during the propagation of the crack for verifying the conditions, $G(0) \geq 2\gamma_e(0)$, and at least one of (2.1) or (2.2) and are regulated according to a recipe in order to align the same, thus forming a closed loop control.

10. The method according to claim 1, wherein
the energy release rate $G_-(\alpha)$ is calculated for the case of an infinitesimal propagation in a start region of the crack dependent on possible deflections about the angle ($\alpha$),
the energy release rate $G_+(\alpha)$ is calculated for a planned target region under the assumption that the crack has remained within the cleavage plane, and
the stress intensity is adjusted such that conditions (2.1) and (2.2) are fulfilled for both functions $G_-(\alpha)$ and $G_+(\alpha)$.

11. A method according to claim 1, wherein a single crystal from a group comprising a II-VI or III-V semiconductor compound, comprising a single crystal comprising GaAs, GaP or InP, or a Si single crystal, or a CaF single crystal, or a SiC— or sapphire single crystal or a GaN single crystal, or a single crystalline plate of these types is separated.

12. A method according to claim 1, wherein a maximum value for a possible adjustment error of an orientation of the crystallographic cleavage plane relative to a cleavage device is provided, and
the step of controlling or regulating the at least one of the stress fields or adapting the pre-adjustment includes a comparison of the at least one condition (2.1) or (2.2) to be maintained during propagation with an angular range represented by the maximum possible adjustment error, wherein the control of the stress fields or the adaption of the pre-adjustment is performed dependent on the result of the comparison.

13. The method of claim 1, wherein the step of generating the at least one stress field comprises controlling or regulating the at least one stress field or the pre-adjustment such that the crack further propagates in the single crystal, and such that $G(0) \geq 2\gamma_e(0)$ and such that at least one of condition 2.1 or condition 2.2 is satisfied.

14. The method of claim 1, wherein the step of generating the at least one stress field comprises adjusting the crystallographic cleavage plane relative to the cleavage device.

* * * * *